(12) United States Patent
White et al.

(10) Patent No.: US 8,796,993 B2
(45) Date of Patent: Aug. 5, 2014

(54) HISTORICAL ANALYSIS OF BATTERY CELLS FOR DETERMINING STATE OF HEALTH

(75) Inventors: David Allen White, Houston, TX (US); Claude Leonard Benckenstein, Jr., Stafford, TX (US)

(73) Assignee: Southwest Electronic Energy Corporation, Missouri City, TX (US)

( * ) Notice: Subject to any disclaimer, the term of this patent is extended or adjusted under 35 U.S.C. 154(b) by 351 days.

(21) Appl. No.: 13/229,914

(22) Filed: Sep. 12, 2011

(65) Prior Publication Data
US 2013/0065093 A1    Mar. 14, 2013

(51) Int. Cl.
*H01M 10/44*    (2006.01)

(52) U.S. Cl.
USPC ............................................ 320/119; 324/427

(58) Field of Classification Search
USPC .......... 320/107, 116, 118, 119, 132; 324/426, 324/427, 433; 702/63, 64
See application file for complete search history.

(56) References Cited

U.S. PATENT DOCUMENTS

| | | | |
|---|---|---|---|
| 6,420,852 B1 | 7/2002 | Sato | |
| 6,437,539 B2 | 8/2002 | Olsson et al. | |
| 6,680,615 B2 | 1/2004 | Nebon et al. | |
| 7,489,106 B1 | 2/2009 | Tikhonov | |
| 7,683,575 B2 | 3/2010 | Berdichevsky et al. | |
| 7,723,958 B2 | 5/2010 | Darilek | |
| 8,288,992 B2 * | 10/2012 | Kramer et al. | 320/119 |
| 8,547,065 B2 * | 10/2013 | Trigiani | 320/119 |
| 2008/0278115 A1 | 11/2008 | Huggins | |
| 2010/0123434 A1 | 5/2010 | Iwata | |
| 2011/0068719 A1 | 3/2011 | Oya | |
| 2011/0080139 A1 | 4/2011 | Troxel et al. | |
| 2011/0089901 A1 | 4/2011 | White et al. | |
| 2011/0156649 A1 | 6/2011 | Wu | |

OTHER PUBLICATIONS

Written Opinion and Search Report of PCT/US2012/045948, mailed Oct. 1, 2012.
Written Opinion and Search Report of PCT/US2012/053771, mailed Mar. 20, 2014.

\* cited by examiner

*Primary Examiner* — Edward Tso
(74) *Attorney, Agent, or Firm* — Fulbright & Jaworski LLP

(57) ABSTRACT

Battery cells may be monitored and a historical profile of the battery generated. The historical profile may be used to analyze a state-of-health of the battery cell. For example, the historical profile may be used to determine when a battery cell has developed an internal short that creates a safety hazard. The historical profile may include a count of the number of times the battery cell was out of balance and a count of the number of Coulombs the battery cell was out of balance. The number of Coulombs may be counted for a window of time. When the number of Coulombs exceeds a Coulomb threshold, a state-of-health flag may be set for the battery cell. The Coulomb threshold may be adjusted based, in part, on the counted number of times the battery cell is out of balance.

20 Claims, 10 Drawing Sheets

HISTORICAL ANALYSIS OF BATTERY CELLS FOR DETERMINING STATE OF HEALTH

TECHNICAL FIELD

The present disclosure is related to rechargeable batteries. More specifically, the present disclosure is related to fault detection in rechargeable batteries.

BACKGROUND

A device powered by rechargeable batteries may include several battery cells to achieve voltage and/or current levels used by the device. For example, if a rechargeable battery cell has a nominal output voltage of 1 Volt, a device having a 2 Volt operational level may include two battery cells coupled in series. In another example, if a rechargeable battery cell has a nominal output current of 100 milliamps, a device having a 400 milliamp operational level may include four battery cells coupled in parallel. Battery cells coupled in parallel and series may be combined to reach the desired operational voltage and current levels of the device.

The battery cells may be grouped with circuitry for balancing the charge levels in the battery cells to form a battery pack system module. Multiple battery pack system modules may be combined in series or parallel to further increase the output voltage and output current available to a device coupled to the battery pack system modules. Battery cells within a battery pack system module may be balanced by using balancing circuitry within the battery pack system module (referred to as intra-module balancing). Battery pack system modules may also be balanced to other battery pack system modules (referred to as inter-module balancing).

Balancing battery cells is an important process for maintaining the health of and correct operation of a battery system comprising multiple battery pack system modules. The battery system may not behave as desired when battery pack system modules are out of balance with each other or battery cells within a battery pack system module are out of balance with each other. For example, an output voltage from and/or capacity in a battery system with unbalanced battery pack system modules or battery cells may be outside a desired range.

Battery cells and battery pack system modules may experience different wear and use patterns. When battery cells and battery pack system modules experience different wear and use patterns they become more out of balance with other battery cells and battery pack system modules. Battery cells or modules may become out of balance with other cells and modules for a variety of reasons.

One cause may be differences in the age of the cells or modules. For example, when old cells or modules are replaced with new cells or modules, the cells or modules may have different capacities. This results because older cells or modules typically have lower capacity. Capacity of battery cells and modules usually uniformly reduces with age until the cell or module has reached end of life.

Another cause may be difference in the capacity of the cells or modules when they are manufactured. The cells or modules may be manufactured by different suppliers with different material sources and different standards. Thus, each module or cell may have a different capacity and a different capacity decay rate. Even when modules or cells are manufactured by the same supplier, the cells or modules used in a system may not be obtained from the same manufacturing lot of the supplier.

A third cause may be differential temperature of the cells or modules. Self-discharge rate for a cell or module is proportional to the cell's temperature, such that a higher temperature causes a cell or module to self-discharge faster. Cells or modules that experience different temperatures throughout operation may suffer different reductions in capacity. The different temperatures may be the result of proximity to other components in a device Another cause may be differential power drain internal to a module. A battery management system may have component variations or a normal current leakage paths resulting in balancing of a module due to internal power drain of the module.

A fifth cause may be differential physical damage to a cell or module. Physical damage may reduce capacity or create internal shorts.

Another cause may be differential leakage of current internal or external to a cell or cells within a module. Differential leakage may be intermittent or continuous and may or may not cause a detectable amount of heat. Pack manufacturing defects are one cause for external differential leakage current. Cell defects or damage are another cause for external differential leakage current. For example, internal cell shorts may occur as a result of anode dendrites, separator dendrites, manufacture metal flake defects, weld splash defects, cell crush damage, excessive cell vibration, and/or shock. These internal shorts may generate localized heat within the interior of a cell.

Even small intermittent shorts may cause lasting damage to a battery cell. Although small intermittent shorts may burn themselves out, their occurrence may weaken the interior of the cell, which leads to more frequent and more severe internal shorts. Over time, and with stresses of charging and discharging, multiple instances of internal shorts may eventually result in an internal short severe enough to cause a thermal run away event. A thermal run away event is the release of a dangerous amount of energy that may destroy the cell within a very short time. The released energy may damage equipment or injure operators.

One conventional solution for monitoring for internal shorts or failure of the battery cells is a temperature monitor placed on an exterior surface or nearby to each battery cell being monitored. However, internal shorts often occur without causing a detectable temperature increase around the battery cell. Even though the temperature does not immediately rise, a thermal runaway event may nonetheless be building in the battery cell. During a future charge cycle of the battery cells, battery cells coupled to the internally shorted battery cell may overcharge, increasing the likelihood of a thermal runaway event due to the additional stress on the otherwise-healthy battery cells. The combination of the stressed healthy battery cells and the heat from the internally shorted battery cell may result in a thermal runaway event occurring that was originally undetectable by an external temperature sensor.

BRIEF SUMMARY

According to one embodiment, a method includes monitoring a plurality of battery cells. The method also includes counting a number of times at least one battery cell of the plurality of battery cells is out of balance with other battery cells of the plurality of battery cells. The method further includes marking the at least one battery cell as faulty based, in part, on the counted number of times.

In further embodiments, the method may include the at least one battery cell being marked faulty when the number of times exceeds a threshold value based, in part, on a number of times the at least one battery cell is out of balance with other battery cells. The method may include storing a time associated with the count when at least one battery cell is out of balance with other battery cells, the time indicating when the at least one battery cell is out of balance with other battery cells and storing a quantity associated with the count when the at least one battery cell is out of balance with the other battery cells, the quantity indicating a charge difference between the at least one battery cell and the other battery cells, in which marking the at least one battery cell as faulty is also based, in part, on the time and quantity of each counted time the at least one battery cell is out of balance with other battery cells. The method may include comparing the counted number of times, quantity information, and time information with at least one known historical profile of a faulty battery cell. The method may include monitoring battery cells in a plurality of battery pack system modules and replacing at least one battery pack system module of the plurality of battery pack system modules containing the at least one battery cell marked as faulty. The method may include determining the at least one battery cell has an internal short. The method may include transmitting a message to a user that the at least one battery cell is faulty and disconnecting the at least one battery cell marked as faulty According to another embodiment, a computer program product includes a non-transitory computer-readable medium having code to monitor a plurality of battery cells. The medium also includes code to count a number of times at least one battery cell of the plurality of battery cells is out of balance with other battery cells of the plurality of battery cells. The medium further includes code to mark the at least one battery cell as faulty based, in part, on the counted number of times.

According to a further embodiment, an apparatus includes a plurality of battery cells and a microprocessor coupled to the plurality of battery cells. The microprocessor is configured to monitor a plurality of battery cells. The microprocessor is further configured to count a number of times at least one battery cell of the plurality of battery cells is out of balance with other battery cells of the plurality of battery cells. The microprocessor is also configured to mark the at least one battery cell as faulty based, in part, on the counted number of times.

In further embodiments, the microprocessor of the apparatus may be configured to mark the at least one battery cell faulty when the number of times exceeds a threshold value based, in part, on a number of times the at least one battery cell is balanced to other battery cells of the plurality of battery cells. The microprocessor may be configured to store a time associated with the count when at least one battery cell is out of balance with other battery cells, the time indicating when the at least one battery cell is out of balance with other battery cells and to store a quantity associated with the count when the at least one battery cell is out of balance with the other battery cells, the quantity indicating a charge difference between the at least one battery cell and the other battery cells, in which marking the at least one battery cell as faulty is also based, in part, on the time and quantity of each counted time the at least one battery cell is out of balance with other battery cells. The processor may be configured to compare the counted number of times, quantity information, and time information with at least one known historical profile of a faulty battery cell. The microprocessor may be configured to transmit a message to a user that the at least one battery cell is faulty. The microprocessor may be configured to disconnect the at least one battery cell marked as faulty. The microprocessor and the plurality of battery cells may be part of a battery pack system module.

According to another embodiment, a method includes counting the number of times a battery cell of an array of battery cells is out of balance with other battery cells. The method also includes determining a Coulomb threshold level based, in part, on the counted number of times. The method further includes counting a number of Coulombs the battery cell is out of balance with the other battery cells. The method also includes setting a state-of-health flag when the counted number of Coulombs exceeds the Coulomb threshold.

In further embodiments, the method may include counting the number of Coulombs over a period of time defined by a window, in which the window is divided into a number of bins. The method may include incrementing a counter in a most recent bin of the number of bins for each update period that the battery cell is out of balance with other battery cells and shifting each of the number of bins to a bin representing an earlier period of time after each bin period. The method may include setting the Coulomb threshold to a low value when the counted number of times exceeds a first count threshold and setting the Coulomb threshold to a high value when the counted number of times does not exceed the first count threshold. The method may include setting a state-of-health flag for the battery cell when the counted number of times exceeds a second count threshold. The method may detect small shorts by setting the state-of-health flag for the battery cell when the counted number of times exceeds a second count and detect larger shorts by setting a state-of-health flag when the counted number of Coulombs exceeds the Coulomb threshold level. The method may also include reporting the battery cell when the state-of-health flag is a first value, disabling charging of the battery cell when the state-of-health flag is a second value, and discharging the battery cell when the state-of-health flag is a third value.

According to yet another embodiment, a computer program product includes a non-transitory computer readable medium having code to count the number of times a battery cell of an array of battery cells is out of balance with other battery cells. The medium also includes code to determine a Coulomb threshold level based, in part, on the counted number of times. The medium further includes code to count a number of Coulombs the battery cell is out of balance with the other battery cells. The medium also includes code to set a state-of-health flag when the counted number of Coulombs exceeds the Coulomb threshold.

According to a further embodiment, an apparatus includes a memory. The apparatus also includes a processor. The processor is configured to count the number of times a battery cell of an array of battery cells is out of balance with other battery cells. The processor is also configured to determine a Coulomb threshold level based, in part, on the counted number of times. The processor is further configured to count a number of Coulombs the battery cell is out of balance with the other battery cells. The processor is also configured to set a state-of-health flag when the counted number of Coulombs exceeds the Coulomb threshold.

The foregoing has outlined rather broadly the features and technical advantages of the present disclosure in order that the detailed description of the disclosure that follows may be better understood. Additional features and advantages of the disclosure will be described hereinafter that form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features that are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawing.

DETAILED DESCRIPTION

Although an external temperature monitor may be insufficient to detect a thermal run away event before it occurs, other methods may be used to detect internal shorts in battery cells or modules. A battery cell with internal shorts may be balanced more frequently or less frequently than other battery cells. For example, when an internal cell short causes a current drain the battery cell discharges faster causing the balancing circuits to direct differential current to respond to the shorted battery cell. A balancing circuit or an external monitor to the balancing circuit, may track the number of times a battery cell is balanced and determine that a battery cell has an internal short before a thermal run away event occurs. The circuit or monitor may determine the battery cell is being excessively balanced by implementing threshold detection such as when a count exceeds a threshold, implementing an algorithm to detect unusual balancing behavior over time, and/or implementing a differential test to determine when the balancing of one cell exceeds an expected number of balancing operations based, in part, on other battery cells being balanced. In one example, a time and a quantity are recorded each time a battery cell is balanced with other battery cells to record how frequently and how much a battery cell is charged or discharged to reach balance with other battery cells.

Figure 1:
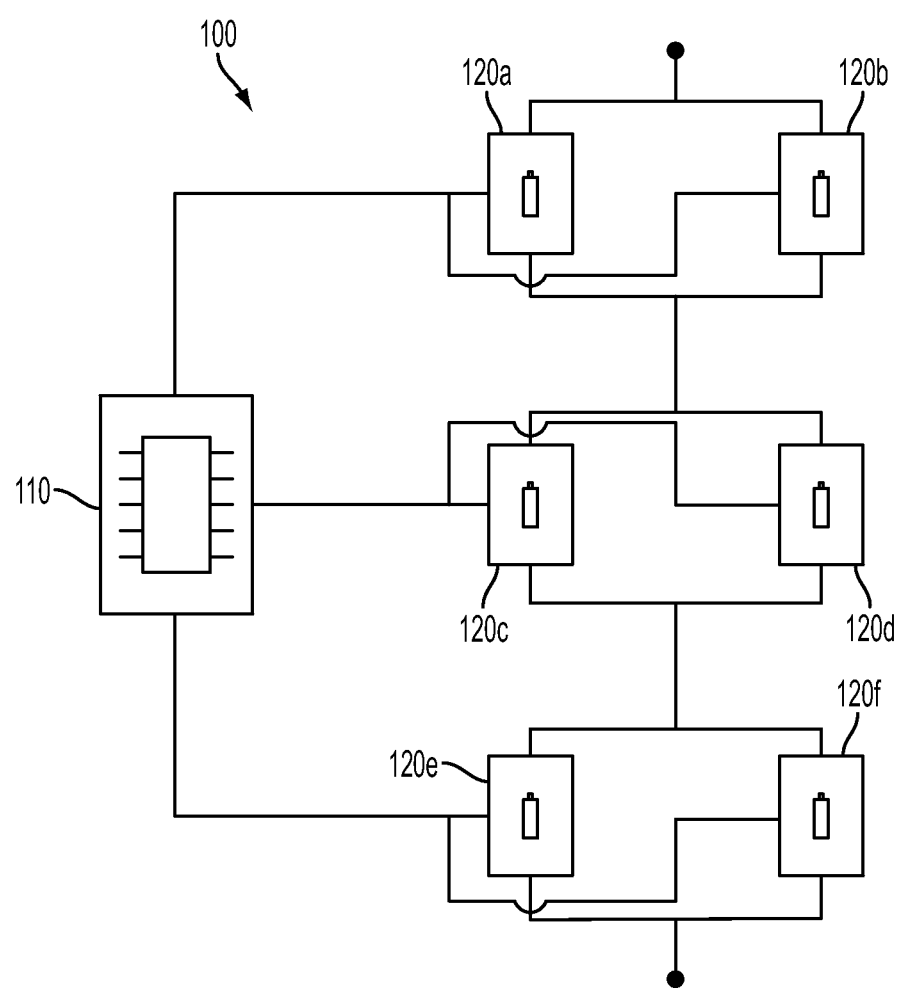
FIG. 1 is a block diagram illustrating a microprocessor balancing a plurality of battery cells according to one embodiment of the disclosure.

FIG. 1 is a block diagram illustrating a microprocessor balancing a plurality of battery cells according to one embodiment of the disclosure. A microprocessor 110 of a battery system 100 may be coupled to communicate with battery cells 120. The battery cells 120 may be, for example, lithium-ion battery cells. The microprocessor 110 may be a general purpose central processing unit ("CPU") or microprocessor, graphics processing unit ("GPU"), microcontroller, or the like. The present embodiments are not restricted by the architecture of the microprocessor 110 so long as the microprocessor 110, whether directly or indirectly, supports the modules and operations as described herein. The microprocessor 110 may execute various logical instructions, as described below and in FIG. 2 and FIG. 3, according to the present embodiments.

According to one embodiment, the microprocessor 110 may communicate directly with circuitry inside the battery cells 120. According to another embodiment, the microprocessor 110 may receive information about the battery cells 120 by measuring the battery cells 120 through external circuitry (not shown), such as a current measurement resistor and/or a voltmeter. The battery cells 120 may be coupled in series and/or in parallel with each other to obtain a desired output current and/or voltage. For example, the battery cells 120 may include battery cells 120a and 120b coupled in parallel to provide an output current twice the output current of either the battery cell 120a or the battery cell 120b individually. In another example, the battery cells 120a and 120b may be coupled in series with the parallel connection of battery cells 120c and 120d and the parallel connection of battery cells 120e and 120f to increase an output voltage of the battery system 100 to three times the output voltage of any of the parallel-coupled battery cells 120a-b, 120c-d, or 120e-f individually.

The battery system 100 may also include charging circuitry and balancing circuitry (not shown) for charging and balancing the battery cells 120a-e. Examples of balancing circuitry are described in U.S. Pat. No. 7,880,434 to White et al., filed on Apr. 2, 2009, and entitled "System for Balancing a Plurality of Battery Pack System Modules Connected in Series" and are described in U.S. patent application Ser. No. 12/899,413 to White et al., filed on Oct. 6, 2010, and entitled "Module bypass switch for balancing battery pack system modules," both of which are hereby incorporated by reference. According to one embodiment, the battery system 100 may be part of a battery pack system module and connected in series or parallel with other battery pack system modules. When the battery system 100 is part of a battery pack system module, the battery system 100 may be balanced through inter-module balancing to obtain balance with other battery pack system modules. The battery cells 120 may also be balanced through intra-module balancing to obtain balance between the battery cells 120.

Figure 2:
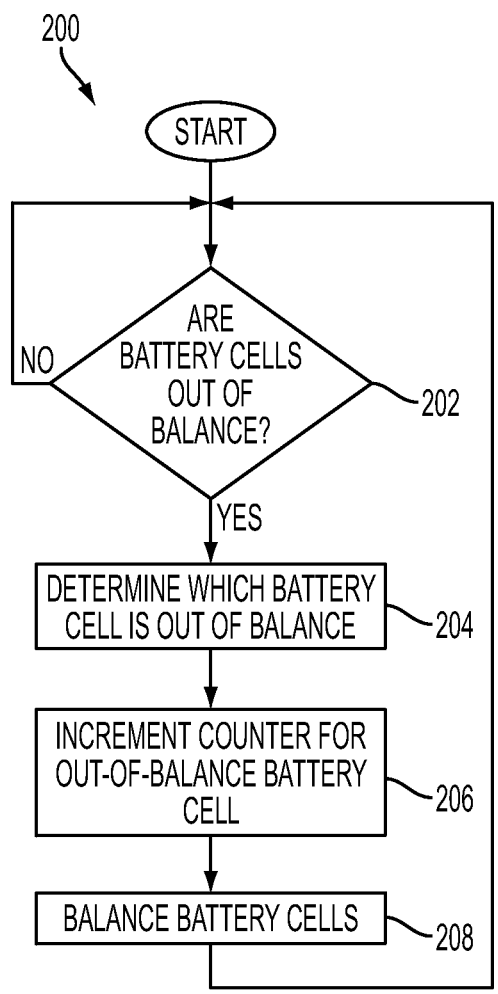
FIG. 2 is a flow chart illustrating a method of balancing a plurality of battery cells according to one embodiment of the disclosure.

The microprocessor 110 may be programmed to monitor and/or direct the balancing of the battery cells 120. FIG. 2 is a flow chart illustrating a method of balancing a plurality of battery cells according to one embodiment of the disclosure. A method 200 begins at block 202 with determining if any of the battery cells 120 are out of balance. If none of the battery cells 120 is out of balance then the method 200 remains at block 202. When one of the battery cells 120 is out of balance, the method 200 proceeds to block 204 with determining which battery cell of the cells 120 is out of balance. At block 206 a counter corresponding to the out-of-balance battery cell is incremented. For example, the microprocessor 110 may store counters for the battery cells 120a-b, 120c-d, and 120e-f in registers inside the microprocessor 110 or in memory (not shown) coupled to the microprocessor 110, which may be PROM, EPROM, EEPROM, optical storage, or the like. If the battery cell 120a is determined to be out of balance at block 204 then a counter for the battery cell 120a is incremented at block 206. Although not shown, isolation diodes may be coupled to the battery cells 120a and 120b, allowing the battery cells 120a and 120b to be charged and/or discharged separately. At block 208 the battery cells are balanced. In the above example, current may be redirected to the battery cell 120a if the battery cell 120a is determined to be out of balance with other battery cells and at a lower state of charge than the other battery cells. Alternatively, in the above example, other battery cells may be discharged to reach balance with the battery cell 120a. After the other battery cells have been discharged to reach balance, all of the battery cells may be charged to full capacity.

Although the example above describes determining a single battery cell is out of balance at block 204, the microprocessor 110 may determine multiple battery cells are out of balance. For example, the microprocessor 110 may determine that the battery cells 120a and 120c are out of balance with other battery cells. Then, at block 206, the microprocessor 110 may increment counters corresponding to the battery cells 120a and 120c, and balance the battery cells 120a and 120c with the other cells at block 208.

According to one embodiment, the microprocessor 110 may determine when one of the battery cells 120 is out of balance with other battery cells by counting Coulombs charged and discharged through the battery cells 120. Additional details for Coulomb counting may be found in U.S. Pat. No. 7,917,315 to Benckenstein et al., filed on Aug. 13, 2008, and entitled "Method for determining power supply usage," which is hereby incorporated by reference. According to another embodiment, the microprocessor 110 may determine when one of the battery cells 120 is out of balance by measuring a voltage across terminals of each of the battery cells 120.

Figure 3:
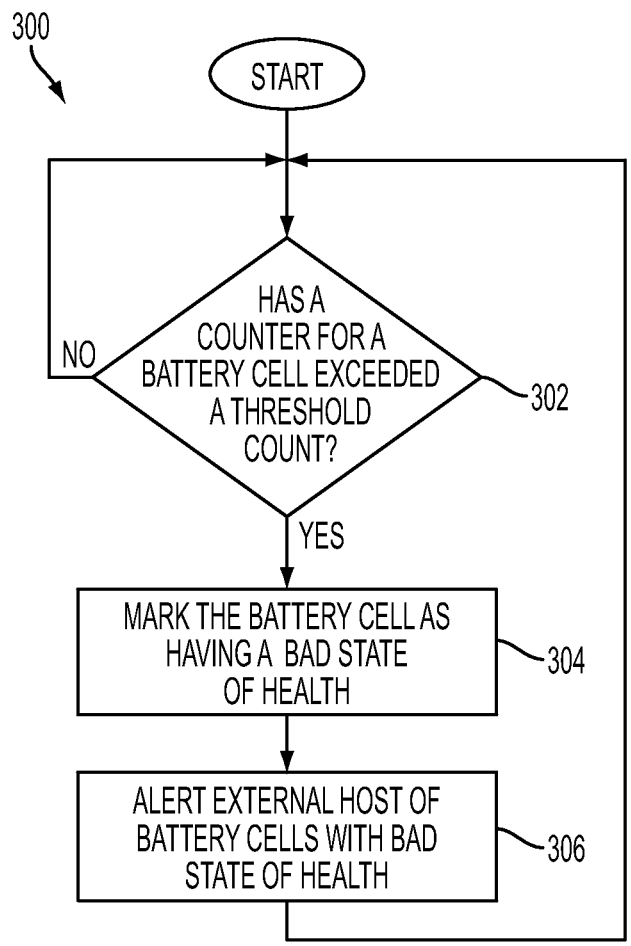
FIG. 3 is a flow chart illustrating a method of determining when a battery cell is faulty according to one embodiment of the disclosure.

When the microprocessor 110 has information regarding the number of times each of the battery cells 120 of a battery system 100 has been out of balance, the microprocessor 110 may determine a state of health, such as whether the battery cell is faulty or has a warning, for each of the battery cells 120. FIG. 3 is a flow chart illustrating a method of determining when a battery cell is faulty according to one embodiment of the disclosure. A method 300 begins at block 302 with the microprocessor 110 determining whether a counter for one of the battery cells 120 has exceeded a threshold count. If none of the battery cells 120 has exceeded the threshold number of balancing operations, the method 300 remains at block 302. When one or more of the battery cells 120 exceeds the threshold count, the method 300 continues to block 304 to mark the battery cell exceeding the threshold number of balancing operations as having a fault. The threshold level of the microprocessor 110 may be adjusted to determine how early a battery cell is marked as having a fault. For example, a threshold level may be set lower to detect faults within the battery cell earlier. According to one embodiment, each of the battery cells 120 may have different threshold levels configurable by a user operating the microprocessor 110. For example, a user may configure the microprocessor 110 with information regarding a make, model, and/or type for each of the battery cells 120 and each make, model, or type may have a different threshold count for determining when the battery cell has reached a faulty state.

At block 306 the microprocessor 110 may alert an external host of battery cells with determined or possible faults. According to one embodiment, the microprocessor 110 may activate a light emitting diode (LED) on a control panel (not shown) indicating to a user that one of the battery cells 120 corresponding to the LED is faulty. In another embodiment, the microprocessor 110 may generate an electronic notification for a user regarding the fault conditions of the battery cells 120. For example, the microprocessor 110 may transmit an electronic mail message or text message to an administrator notifying the administrator when one of the battery cells 120 has reached a faulty state. In another example, the microprocessor 110 may transmit an electronic mail message or text message at periodic intervals, such as hourly, daily, or weekly, with information regarding the state of health of each of the battery cells 120. After block 306 the microprocessor 110 may return to waiting for a battery cell to exceed a threshold count.

According to one embodiment, one or more bits in a register may be assigned as state-of-health alert bits. Each of the bits may correspond to a battery cell or battery pack system module. When a battery cell or battery pack system module is determined to be in a bad state-of-health, the corresponding bit in the register may be set. The microprocessor 110 may then poll the bits to determine when one of the battery cells or battery pack system modules becomes faulty. The polling may be communicated through a MODBUS or RS-485 protocol. When a communications bus capable of posting an alert, such as a CAN bus, is implemented, the state-of-health information may be directly posted on the communications bus without being polled.

Multiple threshold levels may be set for each of the battery cells 120. For example, a first threshold level may be set to indicate a "warning" level for a battery cell, and a second threshold level may be set to indicate a "fault" level for a battery cell. Thus, a user may be notified that a battery cell should be inspected at the next opportunity when the "warning" level is reached. If no action is taken by the user and the number of balancing cycles for a battery cell reaches the second threshold, the user may be notified of the "fault" and the microprocessor 110 may automatically disconnect the faulty battery cell or the entire battery system 100 until a user acknowledges the fault or resets the battery system 100.

In another embodiment, the balance counting method described above in FIG. 2 and FIG. 3 may be combined with other fault detection methods. For example, a battery cell may be marked with a "warning" when the battery cell has reached a threshold number of battery cell balancing operations. Then, if a temperature sensor detects an increase in temperature of the same battery cell, the battery cell may be marked with a "fault."

In yet another embodiment, the threshold count for determining when one of the battery cells 120 is faulty may be specified as a differential value compared to the other battery cells. For example, the battery cell may be determined to have exceeded the threshold count and marked as faulty when one of the battery cells 120 is out of balance twice as many times as one of the other battery cells.

In another embodiment, the threshold count for determining when one of the battery cells 120 is faulty may be based on a detection algorithm. For example, an algorithm may examine the battery cells 120 for behavioral patterns and compare balancing operations of the battery cells 120 to patterns known to result from internal shorts. In another example, an algorithm may examine the battery cells 120 for a certain number of balancing operations within a certain period of time.

One cause for one of the battery cells 120 to exceed the threshold count for number of balancing operations may be that the battery cell has an internal short. An internal short in one of the battery cells 120 may cause reduced capacity of the battery cell, slower charge rate for the battery cell, and/or faster discharge rate for the battery cell. Internal shorts in battery cells may lead to thermal runaway events resulting in a fire, or worse, an explosion. The possibility of fire and explosion resulting from an internal short creates a safety hazard for the operator of equipment powered by the battery cells. When one of the battery cells 120 develops an internal short, the battery cell may exhibit one of the above symptoms resulting in more frequent balancing of the battery cell with the internal short than other battery cells. Thus, monitoring the number of balancing cycles each of the battery cells 120 completes may provide information about an internal short located in the battery cell or another malfunction within the battery cell.

Figure 4:
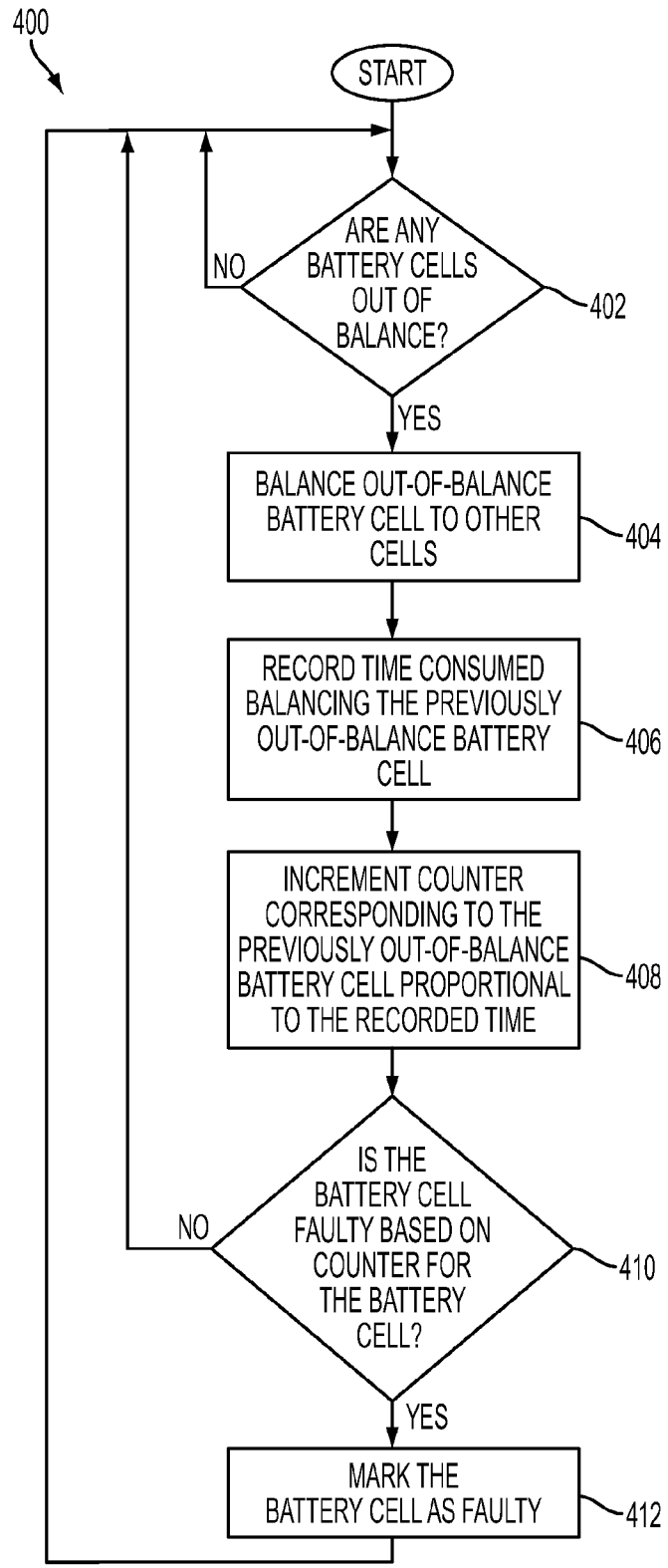
FIG. 4 is a flow chart illustrating a method of determining when a battery cell is faulty based on time consumed balancing an out-of-balance battery cell according to one embodiment of the disclosure.

Although the example above describes an integer counter counting the number of times a battery cell is balanced to other battery cells, the counter may also be, for example, an accumulator. According to one embodiment, the accumulator may be incremented based, in part, on an integrated value of the amount of charge or current used to bring the out-of-balance battery cell into balance with the other battery cells. According to another embodiment, the accumulator may be incremented based, in part, on time spent balancing the out-of-balance battery cell with other battery cells. FIG. 4 is a flow chart illustrating a method of determining when a battery cell is faulty based on time consumed balancing an out-of-balance battery cell according to one embodiment of the disclosure.

A method 400 begins at block 402 with determining if any of the battery cells 120 are out of balance with other battery cells. At block 404 the out-of-balance battery cell is balanced to other battery cells. The out-of-balance battery cell may be at a lower state of charge than other battery cells. When at a lower state of charge, the out-of-balance battery cell may be charged faster than other battery cells until all battery cells are at a substantially similar state of charge. Alternatively, the other battery cells may be discharged faster until all battery cells are at a substantially similar state of charge.

The out-of-balance battery cell may also be at a higher state of charge than other battery cells, in which case the out-of-balance battery cell may be discharged to reach balance or the other battery cells may be charged to reach balance. According to one embodiment, balancing when the battery cell is at a higher state of charged is not added to the battery cell's counter because, when a battery cell is out of balance at a higher state of charge, the out-of-balance condition may not be caused by an internal short. However, the counters for the other battery cells may be incremented, because the other battery cells are considered to be out of balance with the battery cell at a higher state of charge. One battery cell at a higher state of charge than other battery cells may result when the one battery cell has a higher capacity than other battery cells and/or if the one battery cell is at a lower temperature than other battery cells such that the one battery cell does not self-discharge as rapidly as other battery cells. These possibilities may be taken into account by the microprocessor 110 when determining whether to increment the counter for any battery cell.

At block 406 the time consumed balancing the previously out-of-balance battery cell is recorded. The time recorded may be either the time spent charging the previously out-of-balance battery cell or the time spent discharging the other battery cells or both. At block 408 a counter corresponding to the out-of-balance battery cell is increased proportionally to the time recorded at block 406.

At block 410 it is determined whether the previously out-of-balance battery cell is faulty based on its corresponding counter. The determination whether a battery cell is faulty may be based, in part, on the counter corresponding to the battery cell. For example, the battery cell may be determined as faulty when the counter exceeds a threshold count, such as a maximum total amount of time consumed balancing. In another example, the battery cell may be determined as faulty based, in part, on a history of the counter. That is, the history of the counter, such as when and how much the counter has been incremented, may be compared to historical profiles of known faulty battery cells to determine if the counter's history is similar to a known historical profile. According to one embodiment, a correlation score is calculated between the known historical profile and the counter's history. When the correlation score exceeds a threshold value, the battery cell may be marked as faulty. At block 410, only the previously-out-of-balance battery pack's counter may be examined or each of the battery pack's counters may be examined to determine if any of the battery cells is faulty.

Figure 5:
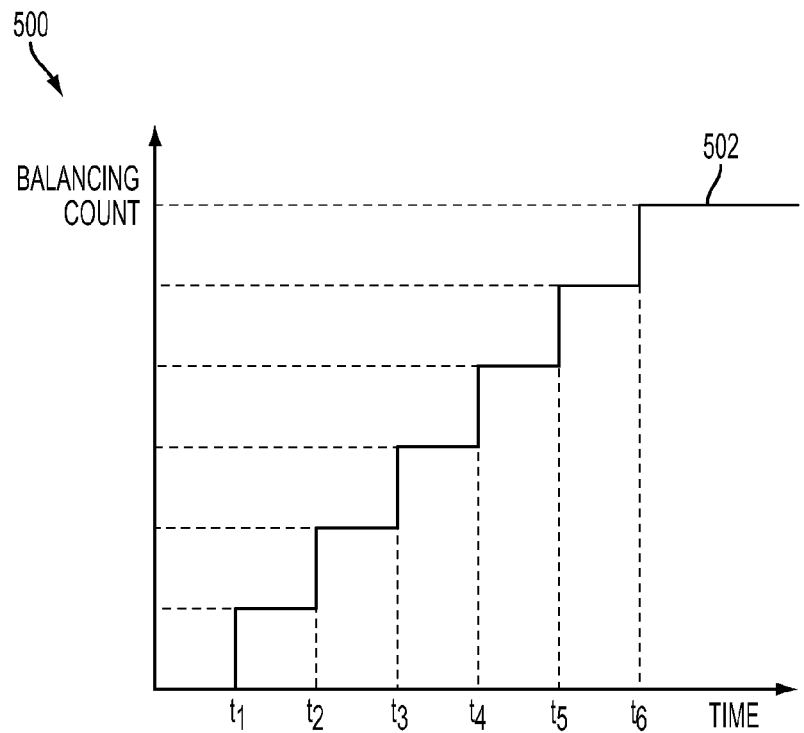
FIG. 5 is a graph illustrating a balancing count history of a possibly faulty battery cell according to one embodiment of the disclosure.

FIG. 5 is a graph illustrating a balancing count history of a possibly faulty battery cell according to one embodiment of the disclosure. A line 502 of a graph 500 illustrates a historical profile of a known faulty battery cell. At each time increment, $t_i$, the battery cell is determined to be out of balance, the battery cell is balanced, and the counter incremented. The battery cell is frequently out of balance based on the stair-step pattern of the line 502.

Figure 6:
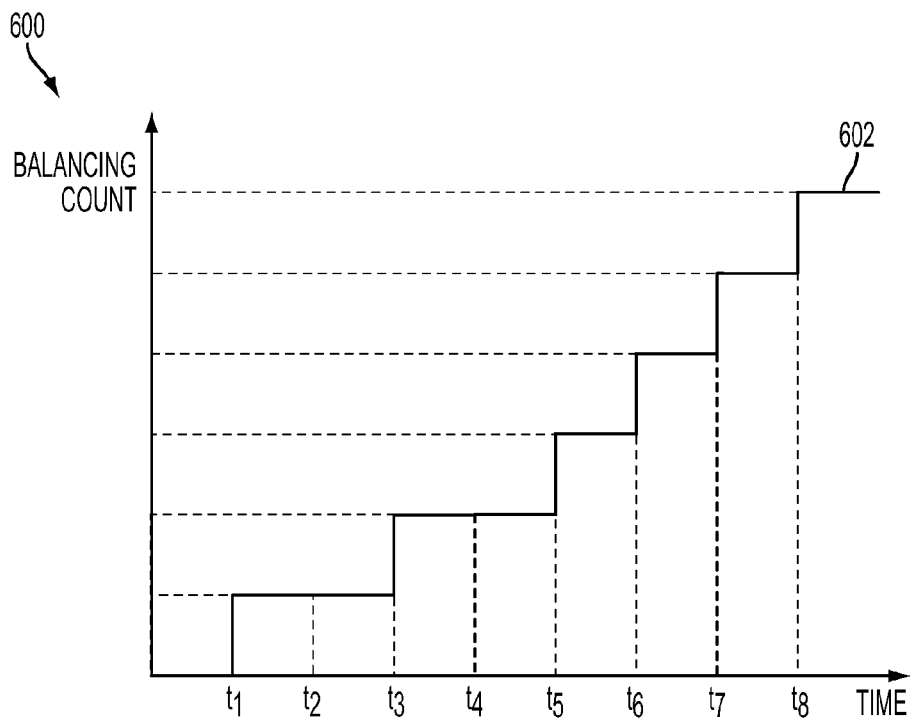
FIG. 6 is a graph illustrating a measured count of a battery cell according to one embodiment of the disclosure.

FIG. 6 is a graph illustrating a measured count of a battery cell according to one embodiment. A line 602 of a graph 600 may be measured for a battery cell and compared to the graph of FIG. 5 to determine if the battery cell is faulty. At times $t_1$, $t_2$, $t_3$, $t_4$, and $t_5$ the correlation between the measured profile and the historical profile of FIG. 5 may not be high enough to trigger an alert that the battery cell is faulty. That is, the counter represented by the line 602 is not increasing as quickly as the counter illustrated by the line 502 of FIG. 5. However, between times $t_5$ and $t_8$ the rate of balancing of the battery cell increases and exhibits a stair-step pattern similar to that of FIG. 5. Thus, the battery cell may be determined as faulty at any time between $t_5$ and $t_8$, based, in part, upon a sensitivity factor in the correlation score calculation. The sensitivity factor and the correlation score calculation may be configured in the microprocessor 110. According to one embodiment, the correlation score calculation may be unique for each of the battery cells and may be based, in part, on a formula corresponding to a make and model of each battery cell. According to another embodiment, the sensitivity factor is also based, in part, upon the make and model of each battery cell.

Referring back to FIG. 4, if a battery cell is determined as faulty as block 410, the battery cell is marked as faulty at block 412. When the battery cell is marked as faulty, the battery cell may be disconnected or an administrator may be notified of the fault. After the battery cell is marked as faulty the method 400 returns to block 402. If no battery cell is determined to be faulty at block 410 the method 400 returns to block 402.

Monitoring the number of balancing cycles each of the battery cells 120 completes is a more reliable method for determining when a possible safety hazard exists in one of the battery cells 120. If only a temperature of the battery cells 120 is monitored a thermal runaway event may already be in progress before a temperature sensor external to the battery cells 120 detects an increase in temperature. Instead, by counting the number of balancing cycles completed for each of the battery cells 120 an internal short may be detected before any increase in temperature due to a thermal runaway event occurs. Thus, the faulty battery cell may be removed, replaced, and/or disabled before additional problems, such as a fire or explosion, occur. Although internal short faults are discussed, the method described above may be used for identifying other faults such as leaking electrolyte.

Several balancing algorithms may operate together to detect shorts in battery cells. According to one embodiment, two balancing algorithms may execute to monitor the state-of-health of battery cells. The state-of-health of a battery cell may be used to determine if the battery cell is faulty. One balancing algorithm may detect small shorts within a battery cell. Another balancing algorithm may detect larger shorts or a coalescence of small shorts. The algorithms may execute in parallel on a processor coupled to the battery cells and/or to circuits coupled to the battery cells. According to one embodiment, feedback may be provided from one balancing algorithm to another balancing algorithm to improve short detection in one or more of the balancing algorithms.

A feedback mechanism between two balancing algorithms may be useful when small shorts occur frequently within a cell. The small short may create a weak spot or pit on a surface of a cell electrode such that the weak spot has a greater likelihood of shorting again or of having a higher current short when a second small short occurs within the area of the weak spot or pit. Over time as the weak spots and pits accumulate, the likelihood of new small short developing and interacting with the existing weak spots and pits to create a larger short increases.

Figure 7:
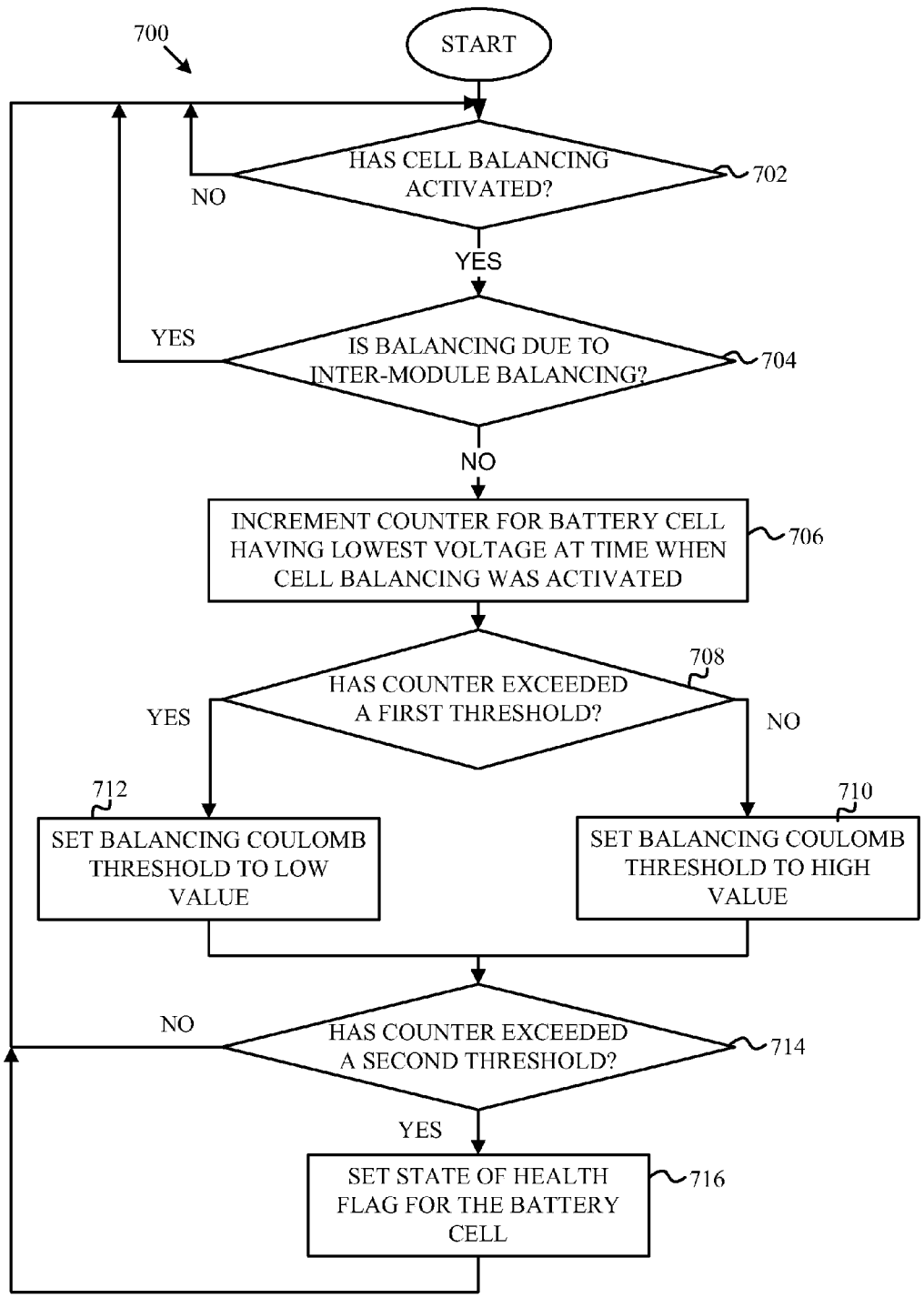
FIG. 7 is a flow chart illustrating an exemplary method for detecting shorts according to one embodiment of the disclosure.
Figure 8:
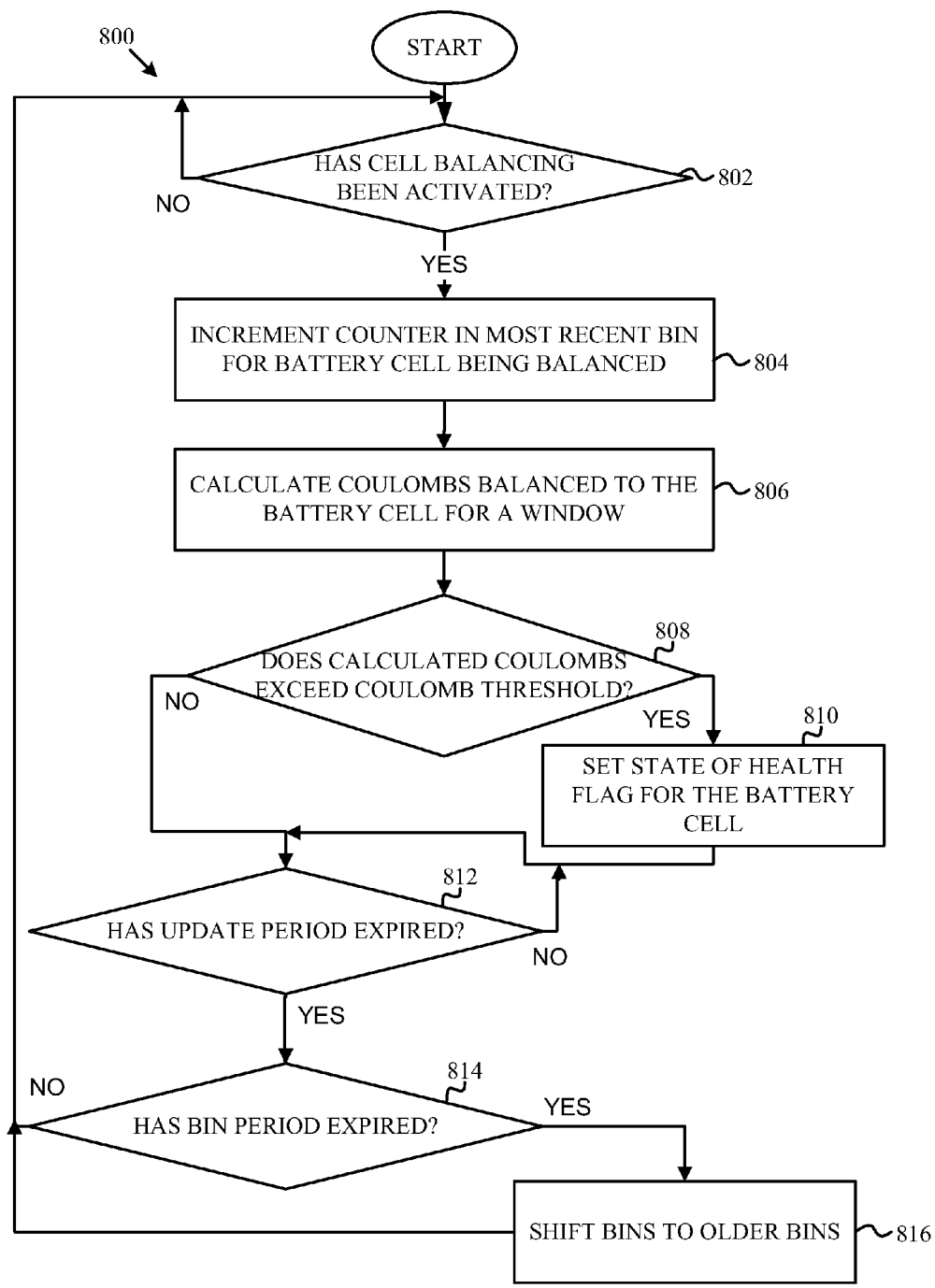
FIG. 8 is a flow chart illustrating an exemplary method for detecting shorts based on historical data according to one embodiment of the disclosure.

FIG. 7 and FIG. 8 will be described below as two balancing algorithms that may operate in parallel or be used separately on a processor. FIG. 7 is a flow chart illustrating an exemplary method for detecting shorts according to one embodiment of the disclosure. The flow chart of FIG. 7 counts state-of-health events for individual battery cells in an array of battery cells. FIG. 8 is a flow chart illustrating an exemplary method for detecting shorts based on historical data according to one embodiment of the disclosure. FIG. 8 counts state-of-health events occurring for individual battery cells in a short duration of time. The number of state-of-health events counted in the flow chart of FIG. 7 may be used, in part, to determine a threshold level for determining when a state-of-health event has occurred in the flow chart of FIG. 8.

Referring to FIG. 7, a method 700 will be described for counting state-of-health events and determining a threshold level for historical analysis of the battery cell. When intra-module balancing occurs (e.g., balancing between battery cells rather than between battery pack system modules) a counter corresponding to the out-of-balance battery cell may be incremented. When the counter exceeds a first threshold, a lower Coulomb threshold may be assigned for evaluating the historical profile of that battery cell. During historical profile evaluation in FIG. 8, an amount of time or amount of charge consumed while balancing the battery cell is recorded for a relatively short duration, in comparison to the recording of FIG. 7. The amount of time spent balancing may be used, in part, to estimate a number of Coulombs the battery cell was out of balance. When this estimated number of Coulombs exceeds a Coulomb threshold, a state-of-health event may be logged. The Coulomb threshold for the flow chart of FIG. 8 may be adjusted by the counting in the flow chart of FIG. 7.

The method 700 begins at block 702 by determining if cell balancing for a battery cell has been activated. If balancing has not been activated, the method 700 remains at block 702 until balancing is activated. When balancing is activated, the method 700 proceeds to block 704 to determine if the balancing is due to inter-module balancing. If inter-module balancing is occurring, then none of the battery cells of the current modules are out of balance and the method 700 returns to block 702 to wait for another balancing activation. If the balancing is not due to inter-module balancing, but instead intra-module balancing, then the method 700 proceeds to block 706.

At block 706 a counter is incremented corresponding to the battery cell having the lowest cell voltage at the time cell balancing was activated. The counter may be part of an array of values where each value in the array represents the number of times balancing has occurred for one battery cell in an array of battery cells. At block 708 it is determined if the counter for the battery cell has exceeded a first count threshold. According to one embodiment, all counters are evaluated at block 708. According to another embodiment, only the counter corresponding to the incremented counter at block 706 is evaluated at block 708.

When the counter for a battery cell exceeds the first count threshold, the method 708 proceeds to block 712 to set the balancing Coulomb threshold to a low value. When the counter does not exceed the first count threshold, the method 708 proceeds to block 710 to set the balancing Coulomb threshold to a high value. The Coulomb threshold value is referred to in FIG. 8 discussed below.

After setting the Coulomb threshold at block 710 or 712, the method 700 continues to block 714 to determine if the counter has exceeded a second count threshold. The second count threshold may be higher than the first count threshold. When the second count threshold is exceeded, the method proceeds to block 716 to set a state-of-health flag for the battery cell corresponding to the counter exceeding the second threshold. Setting the state-of-health flag for the battery cell may initialize other methods. For example, setting the state-of-health flag may initiate a separate method for notifying a user or administrator. After the state-of-health flag is activated at block 716, the method continues to block 702 to wait for another balancing activation. When the counter has not exceeded the second count threshold at block 714, the method 700 continues to block 702 to wait for anther balancing activation.

According to one embodiment, the state-of-health flag may take multiple values, where each value indicates a different severity of the condition of the battery cell. For example, the state-of-health flag may be set based, in part, on how much the counter for the battery cell is above the count threshold. Some or all of the state-of-health values may indicate a fault in the battery cell.

The method 700 of FIG. 7 described above counts balancing activations for individual battery cells in an array of battery cells. The method 700 also determines when the counts for a battery cell exceed a first count threshold and a second count threshold. When the first count threshold is exceeded, a lower threshold level is set to the Coulomb threshold value to increase the sensitivity of the state-of-health determination method of FIG. 8. Otherwise the Coulomb threshold is set at a higher value to reduce the sensitivity of the state-of-health determination method of FIG. 8. Thus, the method 700 of FIG. 7 provides some feedback to the method of FIG. 8. The method 700 further determines when the count for a battery cell exceeds a second count threshold. When the second count threshold is exceeded, a state-of-health flag is set for the battery cell. The balancing activation counters for each battery cell of FIG. 7 may be reset by a user or administrator or automatically reset at scheduled times.

The state-of-health determination of FIG. 8 evaluates a historical profile of a battery to determine state-of-health information for a battery cell. For example, whereas the method 700 of FIG. 7 only counts the number of activations, the method 800 of FIG. 8 may count the number of Coulombs that a battery cell is out of balance with other battery cells. That is, instead of counting the number of times the battery cell is out of balance as in the method 700 of FIG. 7, the method 800 of FIG. 8 may count how many Coulombs the battery is out of balance.

The method 800 begins at block 802 by determining if cell balancing is active. If no cells are being balanced, then the method 800 remains at block 802 until cell balancing is activated. When balancing is activated, the method 800 proceeds to block 804 to increment a counter in the most recent bin for the battery cell with the lowest voltage at the time balancing is activated. According to one embodiment, the counter may be incremented for each of the battery cells that is out of balance with the battery cell to obtain a cumulative value. For example, if the battery cell is part of an array of ten battery cells and the battery cell is at a lower voltage than the other nine battery cells, the counter for the battery cell may be incremented by nine.

Figure 9A:
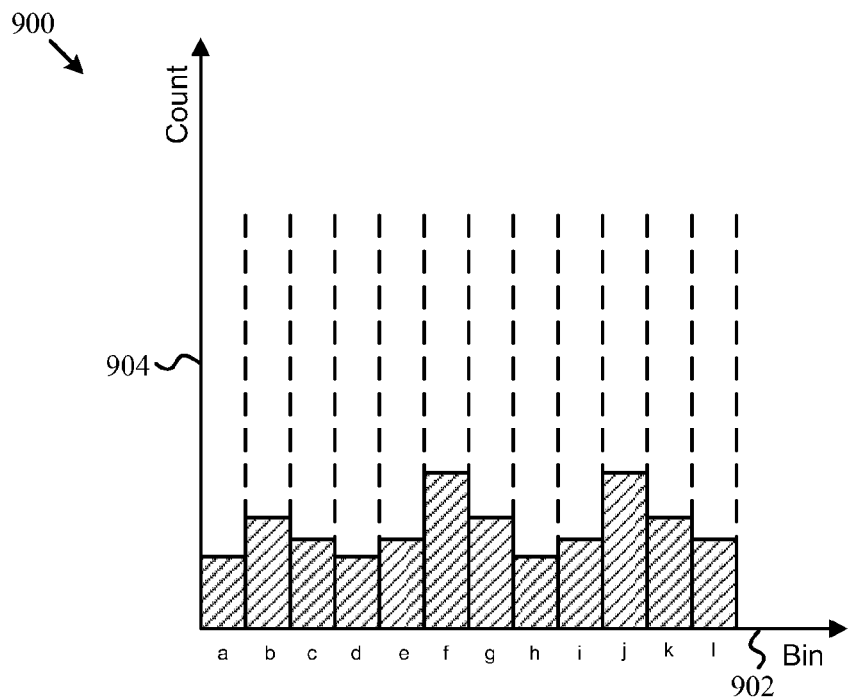
FIG. 9A is a graph illustrating a number of bins for a battery cell according to one embodiment.

According to one embodiment, a number of bins are established for each battery cell. Each bin includes a count of the number of time periods that a battery cell causes balancing to be activated. FIG. 9A is a graph illustrating a number of bins for a battery cell according to one embodiment. A graph 900 includes an x-axis 902 corresponding to bins and a y-axis 904 corresponding to a count for each of the bins on the x-axis 902. A number of bins 902a-l are located along the x-axis 902. Each of the bins 902a-l may have an associated time period. For example, each of the bins 902a-l may store a number of times a battery cell was balanced over a 450 second time period. The counting may be separated by an update interval, which may be, for example, five seconds. That is, every five seconds the most recent bin for a battery cell, bin 902l, may be incremented if the battery cell is out of balance, which may be determined by the battery cell having the lowest voltage of all battery cells when balancing is activated.

Thus, a count of 126 in the bin 902l, when the update period is five seconds, indicates that the battery cell was out of balance for 630 seconds during the bin period. The amount of Coulombs the battery cell was out of balance during the bin time may be obtained by multiplying the time measurement (number of counts to the bin multiplied by the update period) by a current flowing through other battery cells during the balancing time period. For example, when other battery cells having an average cell voltage of 4 Volts are discharged through a 20 Ohm resistor for 630 seconds to balance with the out-of-balance battery cell, the out-of-balance battery cell may be determined to have been out of balance by approximately 126 Coulombs (35 milliAmpere-hours).

Figure 9B:
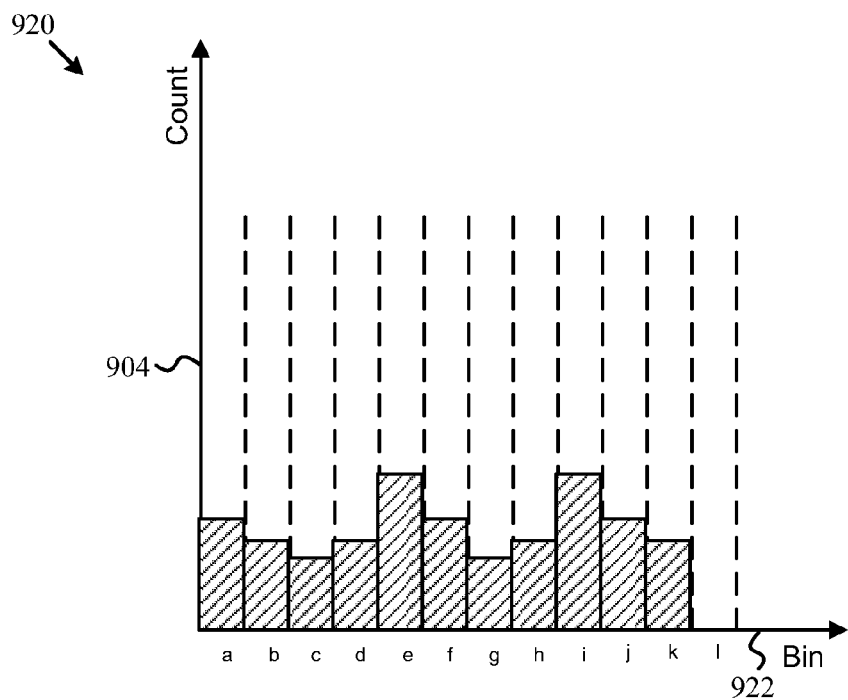
FIG. 9B is a graph illustrating a number of bins for a battery cell after shifting the bins backwards in time according to one embodiment.

After each bin period, the bins are shifted backwards in time and the most recent bin is reset to zero. FIG. 9B is a graph illustrating a number of bins for a battery cell after shifting the bins backwards in time according to one embodiment. A graph 920 includes a number of bins 922a-l one bin period after the graph 900 of FIG. 9A. The bin 922a of FIG. 9B stores the value of the bin 902b of FIG. 9A. The bin 922b of FIG. 9B stores the value of the bin 902c of FIG. 9A. Each of the bins 902b-l is shifted to the bins 922a-k. The bin 902a of FIG. 9A is dropped after the bin period, and the bin 922l is reset to zero.

Referring back to FIG. 8, the method 800 continues to block 806 where it calculates the number of Coulombs the battery cell whose counter was incremented at block 804 was out of balance for a time window. The time window may be defined as a number of bin periods. The window may be some or all of the bin periods 902a-l of FIG. 9A. According to one embodiment, when the window is all of the bin periods, the Coulomb amounts are calculated by summing the counts in each of the bin periods multiplied by the update period of the bin and multiplying this by the average balancing current during the window period.

At block 808 it is determined if the calculated Coulomb amounts exceeds a Coulomb threshold. The Coulomb threshold may be a value determined by the method 700 of FIG. 7. If the calculated Coulomb amount exceeds the Coulomb threshold at block 808, the method 800 continues to block 810 to set a state-of-health flag for the battery cell, and then continues to block 812. If the calculated Coulomb amount does not exceed the Coulomb threshold at block 808, then the method 800 continues to block 812.

At block 812 it is determined if the update period has expired. If the update period has not expired, the method 800 remains at block 812. When the update period has expired, the method 800 continues to block 814. At block 814 it is determined if the bin period has expired. If the bin period has not expired, then the method 800 continues back to block 802. If the bin period has expired, then the method 800 continues to block 816 to shift the bins to older bins, as illustrated in the shift from FIG. 9A to FIG. 9B. After shifting the bins at block 816, the method 800 continues to block 802.

The method 800 described above may have configurable parameters. For example, the update period, the bin period, the window, and the balancing current/resistor may be configured by an administrator or a user. According to one embodiment, the parameters may be adjustable during operation. For example, the update period may be decreased to obtain finer resolution of Coulomb counting in the method 800.

According to one embodiment, the method 800 may be a cross-correlation of a first function (e.g., a Coulomb count as a function of time) with a second function (e.g., a window function which is a constant for a certain window of time). In further embodiments, the method 800 may be modified to perform a cross-correlation with a different first function and/or a different second function. For example, the second function may be a function of time in which the function represents a weight assigned to a portion of the time window. Thus, the state-of-health determination of a method according to such an embodiment may weight more recently occurring balancing events higher than older balancing events or vice versa. In another embodiment, the second function may include a predictive quantity for including future predicted balancing events. In yet another embodiment, the second function may be an arbitrary function based, in part, on a characteristic signature of Coulomb counts over time that is predictive of a thermal runaway event discovered during researching or operating the battery cell.

Figure 10:
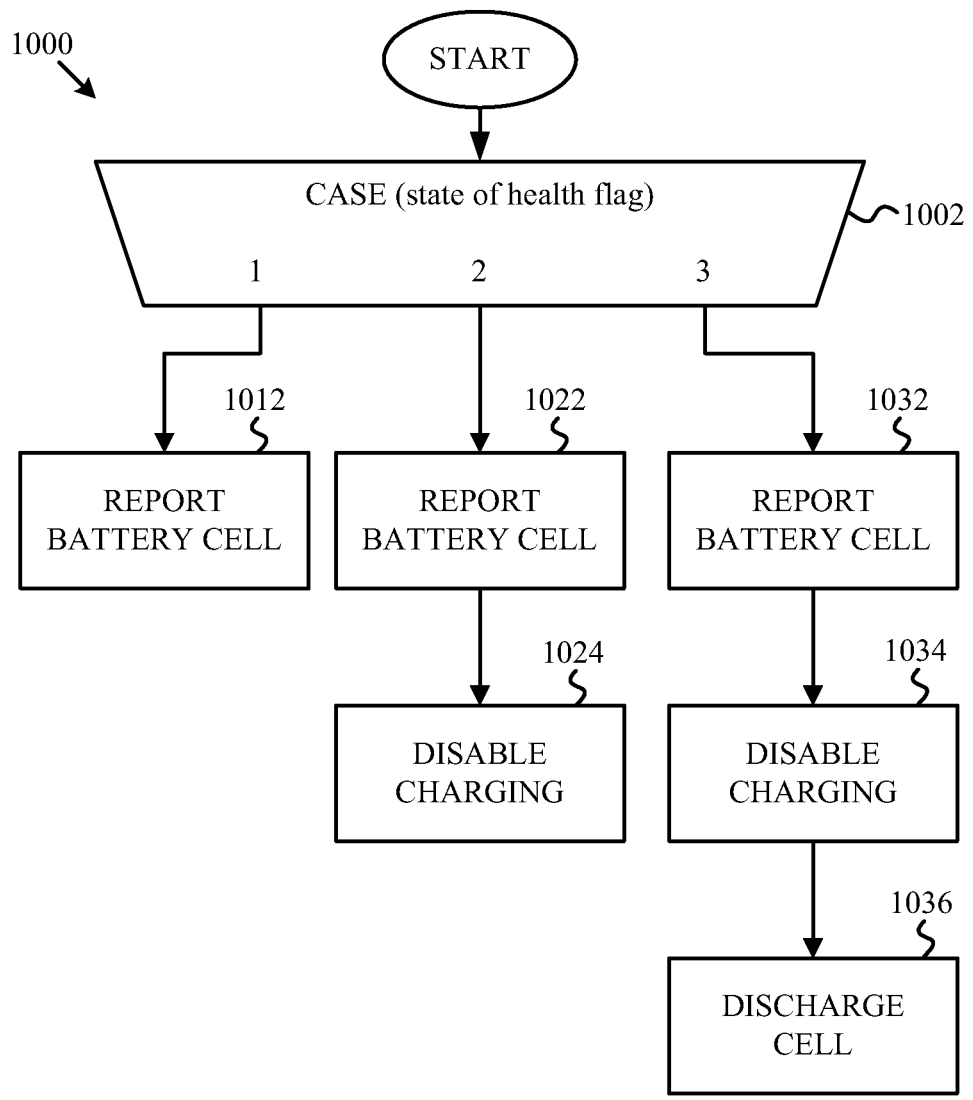
FIG. 10 is a flow chart illustrating actions taken based on the state-of-health flag according to one embodiment of the disclosure.

After a state-of-health flag is set by the methods described above, such as by the method 700 of FIG. 7 or by the method 800 of FIG. 8, actions may be performed on the battery cell. FIG. 10 is a flow chart illustrating actions taken based on the state-of-health flag according to one embodiment of the disclosure. A method 1000 begins at block 1002 with selecting a case based on the state-of-health flag value. When the value of the state-of-health flag is a first value, such as '1', the method 1000 proceeds to block 1012 to report the battery cell. The report may be, for example, a display activated on the battery and/or a message sent wirelessly or otherwise to a user or administrator. When the value of the state-of-health flag is a second value, such as '2', the method 1000 proceeds to block 1022 to report the battery cell and then to block 1024 to disable charging for the battery cell. When the battery cell is part of a battery pack system module, discharging for the module may also be disabled at block 1024. When the value of the state-of-health flag is a third value, such as '3', the method 1000 proceeds to block 1032 to report the battery cell, then to block 1034 to disable charging, and then to block 1036 to discharge the battery cell. When the battery cell is part of a battery pack system module, the module may also be discharged at block 1036.

Although FIG. 10 is described as performing a case statement on the state-of-health flag, the case statement may also be performed from a configurable setting for the battery pack. For example, the state-of-health flag may be a Boolean value. When the state-of-health flag is set the configurable parameter is examined to determine a course of action. When the configurable parameter has a first value, the battery cell having the state-of-health-flag may be reported. When the configurable parameter has a second value, a report may be generated for the battery cell and charging disabled for the battery cell. When the configurable parameter has a third value, a report may be generated for the battery cell, charging disabled for the battery cell, and the battery cell may be discharged. The configurable parameter may be set by a user or administrator or automatically selected by the processor. The configurable parameter may be based, in part, on the battery cell size and configuration.

Figure 11:
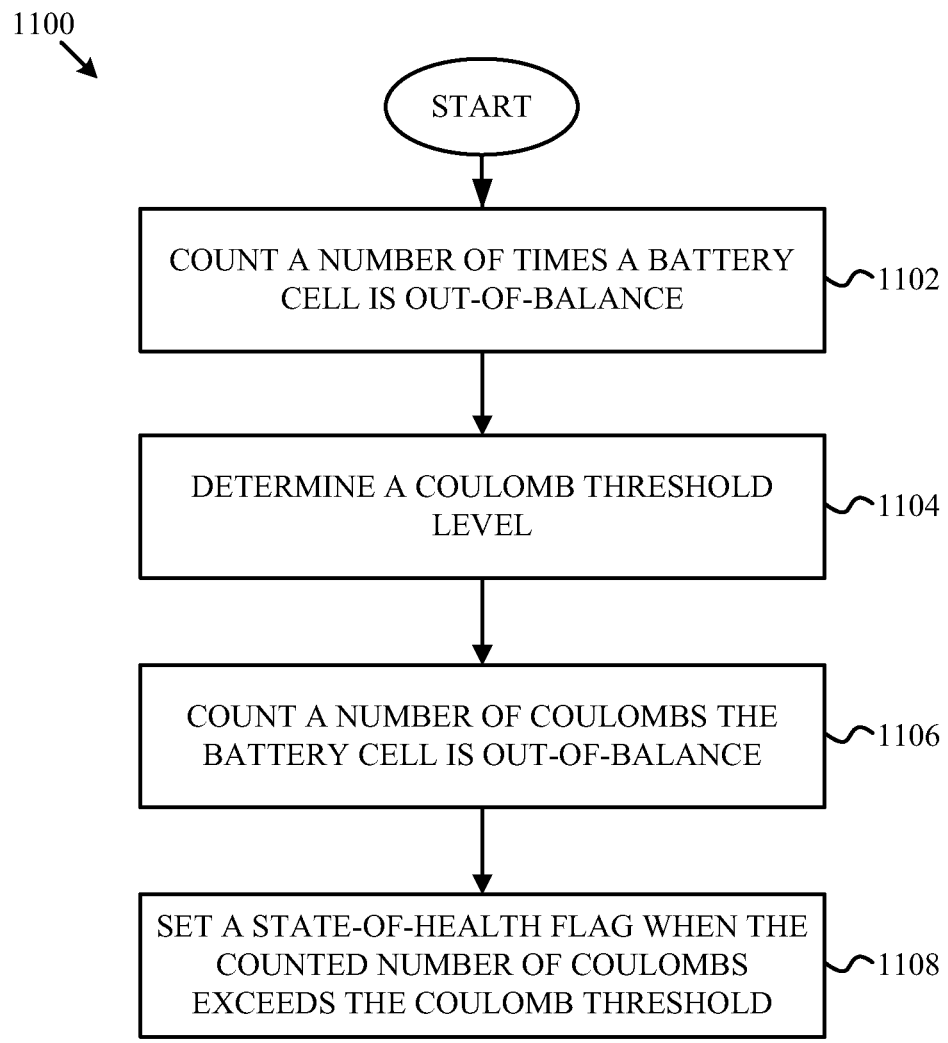
FIG. 11 is a flow chart illustrating a method for detecting shorts in a battery cell according to one embodiment of the disclosure.

FIG. 11 is a flow chart illustrating a method for detecting shorts in a battery cell according to one embodiment of the disclosure. A method 1100 begins at block 1102 by counting a number of times a battery cell is out of balance. The method 1102 proceeds to block 1104 to determine a Coulomb threshold level based, in part, on the counted number of times at block 1102. The method 1104 then proceeds to block 1106 to count a number of Coulombs the battery cell is out of balance with other battery cells. At block 1108 a state-of-health flag may be set for the battery cell when the counted number of Coulombs at block 1106 exceeds the Coulomb threshold level set at block 1104.

Although counting is described above for intra-module balancing of battery cells within a battery pack system module, the method may also be applied to counting balancing of battery pack system modules. When one battery pack system module is frequently balanced in comparison to other battery pack system modules, the battery pack system module may be marked as faulty and replaced by a user with a new battery pack system module.

If implemented in firmware and/or software, the functions described above with reference to FIGS. 2, 3, 4, 7, 8, 10, and 11 may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
counting the number of times a battery cell of an array of battery cells is out of balance with other battery cells;
determining a Coulomb threshold level based, in part, on the counted number of times;
counting a number of Coulombs the battery cell is out of balance with the other battery cells; and
setting a state-of-health flag when the counted number of Coulombs exceeds the Coulomb threshold level.

2. The method of claim 1, in which the step of counting the number of Coulombs comprises counting the number of Coulombs over a period of time defined by a window, in which the window is divided into a number of bins.

3. The method of claim 2, in which the step of counting the number of Coulombs comprises:
incrementing a counter in a most recent bin of the number of bins for each update period that the battery cell is out of balance with other battery cells; and
shifting each of the number of bins to a bin representing an earlier period of time after each bin period.

4. The method of claim 1, in which the step of determining the Coulomb threshold comprises:
setting the Coulomb threshold to a low value when the counted number of times exceeds a first count threshold; and
setting the Coulomb threshold to a high value when the counted number of times does not exceed the first count threshold.

5. The method of claim 4, further comprising setting a state-of-health flag for the battery cell when the counted number of times exceeds a second count threshold.

6. The method of claim 5, in which setting the state-of-health flag for the battery cell when the counted number of times exceeds a second count threshold detects small shorts in the battery cell and in which setting a state-of-health flag when the counted number of Coulombs exceeds the Coulomb threshold level detects larger shorts in the battery cell.

7. The method of claim 1, further comprising:
reporting the battery cell when the state-of-health flag is a first value;
disabling charging of the battery cell when the state-of-health flag is a second value; and
discharging the battery cell when the state-of-health flag is a third value.

8. A computer program product, comprising:
a non-transitory computer readable medium comprising:
code to count the number of times a battery cell of an array of battery cells is out of balance with other battery cells;
code to determine a Coulomb threshold level based, in part, on the counted number of times;
code to count a number of Coulombs the battery cell is out of balance with the other battery cells; and
code to set a state-of-health flag when the counted number of Coulombs exceeds the Coulomb threshold.

9. The computer program product of claim 8, in which the code to count the number of Coulombs comprises code to count the number of Coulombs over a period of time defined by a window, in which the window is divided into a number of bins.

10. The computer program product of claim 9, in which the medium further comprises:
code to increment a counter in a most recent bin of the number of bins for each update period that the battery cell is out of balance with other battery cells; and
code to shift each of the number of bins to an older bin after each bin period.

11. The computer program product of claim 8, in which the medium further comprises:
code to set the Coulomb threshold to a low value when the counted number of times exceeds a first count threshold; and
code to set the Coulomb threshold to a high value when the counted number of times does not exceed the first count threshold.

12. The computer program product of claim 11, in which the medium further comprises code to set a state-of-health flag for the battery cell when the counted number of times exceeds a second count threshold.

13. The computer program product of claim 12, in which the code to set the state-of-health flag for the battery cell, when the counted number of times exceeds a second count threshold, detects small shorts in the battery cell and in which the code to set a state-of-health flag, when the counted number of Coulombs exceeds the Coulomb threshold level, detects larger shorts in the battery cell.

14. The computer program product of claim 8, in which the medium further comprises:
code to report the battery cell when the state-of-health flag is a first value;
code to disable charging of the battery cell when the state-of-health flag is a second value; and
code to discharge the battery cell when the state-of-health flag is a third value.

15. An apparatus, comprising:
a memory; and
at least one processor, in which the at least one processor is configured:
to count the number of times a battery cell of an array of battery cells is out of balance with other battery cells;
to determine a Coulomb threshold level based, in part, on the counted number of times;
to count a number of Coulombs the battery cell is out of balance with the other battery cells; and
to set a state-of-health flag when the counted number of Coulombs exceeds the Coulomb threshold.

16. The apparatus of claim 15, in which the at least one processor is further configured to count the number of Coulombs over a period of time defined by a window, in which the window is divided into a number of bins stored in the memory.

17. The apparatus of claim 16, in which the at least one processor is further configured:
to increment a counter in a most recent bin of the number of bins for each update period that the battery cell is out of balance with other battery cells; and
to shift each of the number of bins to an older bin after each bin period.

18. The apparatus of claim 15, in which the at least one processor is further configured:
to set the Coulomb threshold to a low value when the counted number of times exceeds a first count threshold; and
to set the Coulomb threshold to a high value when the counted number of times does not exceed the first count threshold.

19. The apparatus of claim 18, in which the at least one processor is further configured to set a state-of-health flag for the battery cell when the counted number of times exceeds a second count threshold.

20. The apparatus of claim 19, in which the at least one processor is further configured:
to report the battery cell when the state-of-health flag is a first value;
to disable charging of the battery cell when the state-of-health flag is a second value; and
to discharge the battery cell when the state-of-health flag is a third value.

* * * * *